United States Patent [19]

Shi et al.

[11] Patent Number: 5,773,931
[45] Date of Patent: Jun. 30, 1998

[54] ORGANIC ELECTROLUMINESCENT DEVICE AND METHOD OF MAKING SAME

[75] Inventors: Song Shi, Phoenix; Franky So, Tempe, both of Ariz.; Hsing Chuy Lee, Calabasas, Calif.

[73] Assignee: Motorola, Inc., Schaumburg, Ill.

[21] Appl. No.: 708,338

[22] Filed: Sep. 6, 1996

[51] Int. Cl.⁶ .................................................. H05B 33/12
[52] U.S. Cl. ......................... 313/509; 313/504; 313/505
[58] Field of Search ...................... 313/504, 505, 313/506, 509

[56] References Cited

U.S. PATENT DOCUMENTS

| | | | |
|---|---|---|---|
| 5,276,380 | 1/1994 | Tang ............................ | 313/504 |
| 5,294,869 | 3/1994 | Tang et al. .................... | 313/504 |
| 5,294,870 | 3/1994 | Tang et al. .................... | 313/504 |
| 5,302,468 | 4/1994 | Namiki et al. ................. | 313/504 |

FOREIGN PATENT DOCUMENTS 96103890.8  9/1996  European Pat. Off. .

*Primary Examiner*—Nimeshkumar Patel
*Attorney, Agent, or Firm*—Eugene A. Parsons

[57] ABSTRACT

An organic electroluminescent light emitting display device includes layers of organic electroluminescent material (24) (28) disposed between electrodes (12), (34) (38) for emitting an optical effect. The layers (24) (28) provide discrete electroluminescent pixels which are electrically isolated from one another by wall structures (16) (18) (20). The wall structures are preferably fabricated of dielectric materials. Further, the wall structures are characterized by the width in which a middle portion thereof is narrower than the top portion or the base portion.

7 Claims, 1 Drawing Sheet

ORGANIC ELECTROLUMINESCENT DEVICE AND METHOD OF MAKING SAME

TECHNICAL FIELD

This invention relates in general to flat panel information display devices and in particular to light emitting organic electroluminescent information display devices.

BACKGROUND OF THE INVENTION

Until fairly recently, the preferred, indeed the only means by which to display information in the electronic medium was to use a video monitor comprising a cathode ray tube ("CRT"). CRT technology has been well known for over 50 years, and has gained widespread commercial acceptance in applications ranging from desktop computer modules to home televisions and industrial applications. CRTs are essentially large vacuum tubes having one substantially planar surface upon which information is displayed. Coated on the inside of the CRT planar surface is a layer of phosphors which respond by emitting light when struck by electrons emitted from the electron gun of the CRT. The electron gun is disposed in an elongated portion which extends away from the inside of the CRT display surface.

While CRTs are widely used in numerous applications, there are several inherent limitations to the application of CRT technology. For example, CRTs are relatively large and consume a great deal of energy. Moreover, as they are fabricated of glass, the larger the display surface, the heavier the CRT. Given the need for the electron gun to be spacedly disposed from the inside of the display surface, CRTs have a substantial depth dimension. Accordingly, CRTs have little use in small and portable applications, such as handheld televisions, laptop computers, and other portable electronic applications which require the use of displays.

To answer the needs of the marketplace for smaller, lighter, more portable display devices, manufacturers have created numerous types of flat panel display devices. Examples of flat panel display devices include active matrix liquid crystal displays (AMLCD's), plasma displays, and electroluminescent displays. Each of these types of displays has use for a particular market application, though each is accompanied by various limitations which make them less than ideal for certain applications. Principal limitations inherent in devices such as AMLCD's relate to the fact that they are fabricated predominantly of inorganic semiconductor materials by semiconductor fabrication processes. These materials and processes are extremely expensive, and due to the complexity of the manufacturing process, cannot be reliably manufactured in high yields. Accordingly, the costs of these devices are very high with no promise of immediate cost reduction.

One preferred type of device which is currently receiving substantial research effort is the organic electroluminescent device. Organic electroluminescent devices ("OED") are generally composed of three layers of organic molecules sandwiched between transparent, conductive and/or metallic conductive electrodes. The three layers include an electron transporting layer, an emissive layer, and a hole transporting layer. Charge carriers specifically, electrons and holes, are generated in the electron and hole transporting region. Electrons are negatively charged atomic particles and holes are the positively charged counterparts. The charge carriers are injected into the emissive layer, where they combine, emitting light. OED's are attractive owing to low weight, thin profile, and low driving voltage, i.e., less than about 20 volts. Hence, they have a potential application to full color flat emissive displays.

While OED's have found many applications in consumer and industrial products, a problem remains in the fact that they are not easily fabricated in a manner allowing for discrete pixelation of the displays. That is, individual, discrete picture elements or pixels are typically not easily manufacturable due to the fact that the organic layers of materials which are being deposited are difficult to be patterned. Pixels are necessary in order to provide a display having high resolution and good viewability for a particular application. Pixelated OED's have been attempted on numerous previous occasions, such as, for example, in U.S. Pat. No. 5,276,380 to Tang which discloses a scheme using multi-insulative walls to define cathode electrodes in OED's. To achieve the target image of the display device, a directional or angle deposition technique is necessary. The preferred deposition angle is defined as the angle between the deposition surface and the travel direction of the metal atoms to be deposited. This is on the order of from 10° to 45° from normal. However, it is well known that it is difficult to implement the angle technique in a commercial manufacturing line where large scale panels, i.e., on the order of eight inches by eight inches or larger, are usually employed. This type of angle deposition technique will significantly increase the cost of the manufacturing process, as well as reducing the production yield. Moreover, due to the difficulties inherent in angle deposition techniques, long term reliability of a device fabricated according to this method is questionable.

Accordingly, there exists a need for a new process by which to fabricate pixelated organic electroluminescent display devices. The process should avoid angle deposition techniques so as to be consistent with commercial manufacturing line technology. Moreover, the technique should allow for high throughput, high reliability, and low manufacturing costs.

DETAILED DESCRIPTION OF THE PREFERRED EMBODIMENT

Figure 1:
FIGS. 1–7 are a series of cross-sectional side views of an organic electroluminescent device, in accordance with the instant invention.

While the specification concludes with claims defining the features of the invention that are regarded as novel, it is believed that the invention will be better understood from a consideration of the following description in conjunction with the drawing figures, in which like reference numerals are carried forward.

Referring now to FIGS. 1–7, there is illustrated therein both an organic electroluminescent device and a method for fabricating the same. The organic electroluminescent device is fabricated on a substrate 10 such as that illustrated in FIGS. 1–7. Hence, the first step in the fabrication process is to provide a substrate upon which the organic electroluminescent device may be fabricated. The substrate 10 is preferably transparent and may be fabricated of any of a number of known materials employed in the art. For example, the substrate 10 may be fabricated of a glass such as Corning 7059 glass, transparent plastic substrates made of polyolefins, polyethersulfones, polyarylates, and combinations thereof. In one preferred embodiment, the substrate 10 is fabricated of a glass of quality acceptable for flat panel display applications.

Figure 2:
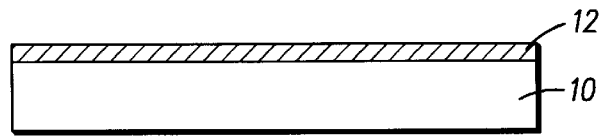

Thereafter, and referring specifically now to FIG. 2, there is deposited atop one surface of the substrate 10, a layer of a first electrode material 12 which is electrically conductive and optically transparent or at least semitransparent. Several materials may be advantageously employed as the first electrode for an OED device. Examples of such materials include conductive metal oxides such as indium oxide, indium tin oxide (ITO), zinc oxide, zinc tin oxide, conductive transparent polymers such as polyaniline and combinations thereof. Alternatively, the electrode 12 may be fabricated of a semi-transparent metal, examples of which include a thin layer (i.e. on the order of less than 500 angstroms) of gold, copper, silver, and combinations thereof. In one preferred embodiment, the electrode 12 is fabricated of either ITO or zinc oxide.

Figure 3:
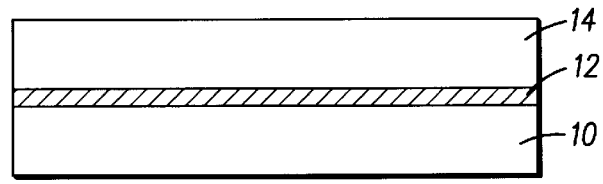

Thereafter, and referring now to FIG. 3, deposited atop layer 12, is a layer of dielectric material 14. The dielectric material may be fabricated or deposited as by any of a number of known techniques in the art. The layer of material 14 is preferably fabricated of a dielectric media such as photoresists, polyimides, photosensitive polyimides, epoxies, photosensitive epoxies, $SiO_x$, $SiN_x$, $SiC_x$, $MgF_x$, and combinations thereof. In one preferred embodiment, the layer of dielectric material is fabricated of photosensitive polyimides, deposited to a total thickness of between 0.5 micrometer and 100 micrometer, and preferably about 1 to 10 micrometer. The layer of material 14 may also be fabricated of an opaque material such as an opaque polyimide. This has the advantage of providing a "black matrix" around each display pixel, as will be described in greater detail hereinbelow. This will afford greater contrast for the display.

Figure 4:
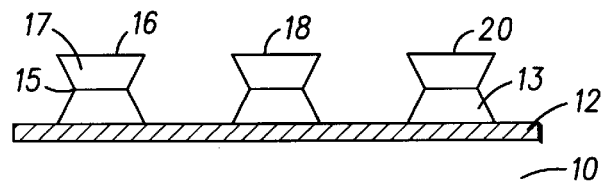
Figure 5:
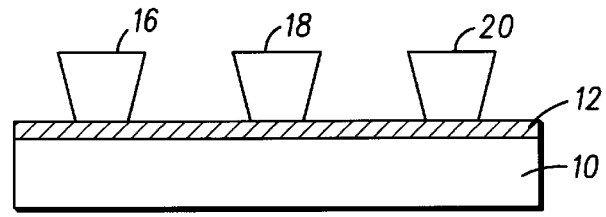

Thereafter, and as is illustrated in FIG. 4, layer 14 of dielectric material is treated, as by etching or other well known techniques in the art, so as to selectively remove portions of the dielectric material. This is done so as to form a plurality of exposed areas of electrically conductive material 12, as well as a plurality of dielectric wall structures 16, 18, and 20. Each of the wall structures is characterized by a base portion 13 which is adjacent to the layer of electrically conductive material 12, a middle portion 15, and a top position 17. The middle portion may be the narrowest part of the wall. In a preferred embodiment, the dimensions of the wall structures are controlled so that the width of the three portions are as follows: base portion>middle portion <top portion. The profile of the dielectric wall may also take other shapes though the proffered profile condition is preferably observed: i.e., the middle portion is narrower than the top and base portion. Alternatively, and as illustrated in FIG. 5, the wall structure may be tapered so that the base portion is narrower than the top portion.

In another embodiment of the present invention, the wall structures 16, 18, 20 may be fabricated of two or more different dielectric materials. Thus, for example, the base portion up to the narrow middle portion, may be fabricated of a first dielectric material, while the rest of the middle portion and the top portion may be fabricated of a second dielectric.

Figure 6:
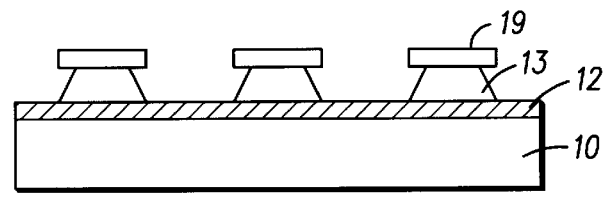

Alternatively, the two layers of the dielectric wall structures may take the shape as shown in FIG. 6, where the first layer of dielectric material is patterned into dielectric base 13 while a second layer of dielectric material is patterned into a "lip" shape 19. In this case, the critical width condition to be maintained is that the base portion is wider adjacent layer 12 than adjacent lip shape 19.

In the two dielectric material system, the individual thickness of the two layers of dielectric materials may vary, but total thickness of the two dielectric materials are preferred to be between 0.5 micrometer and 100 micrometer, and particularly preferably about 1 to 10 micrometer. The two dielectric materials are preferably chosen to have different chemical responses to etching conditions. They either have different etching rates in response to the same etchant or require different etchants to etch. The materials are preferably selected from organic and inorganic dielectric media such as photoresists, polyimides, photosensitive polyimides, epoxies, photosensitive epoxies, $SiO_x$, $SiN_x$, $SiC_x$, $MgF_x$. The processing techniques needed to produce the different profiles of the dielectric walls disclosed in this invention are well known in the photolithography of silicon technology.

Figure 7:
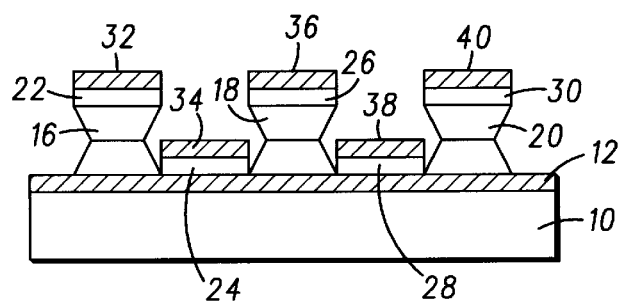

Thereafter and as illustrated specifically in FIG. 7, the layers of organic electroluminescent materials are deposited atop the structure of FIG. 4. As is well known in the art, the organic layers of an organic electroluminescent device comprises at least three and up to six layers of materials: hole injecting layers, hole transport layers, emissive layers, electron injecting layers, and electron transport layers. For purposes of this invention, the series of layers are illustrated as but one single layer deposited on the structure of FIG. 4. Hence, the organic electroluminescent layers are deposited in the fashion so that they coat both the tops of the wall structures 16, 18, and 20 as well as the exposed portions therebetween, specifically, the opening between each two adjacent wall structures. Thus, a layer of organic electroluminescent display material 22 is disposed atop wall structure 16, and layer 24 is disposed on the exposed area of layer 12, between adjacent wall structures 16 and 18. Layer 26 is disposed atop wall structure 18, layer 28 is disposed in the exposed region between structures 18 and 20 and layer 30 is disposed atop wall structure 20. The exact organic materials selected for use in the layers of the organic electroluminescent material may be any of those known in the art.

Disposed atop the organic electroluminescent layers 22, 24, 26, 28, 30 is a layer of a second electrode material 32, 34, 36, 38, 40 respectively. The second electrode is typically fabricated of a metal of work function of less than 4 electron volts and at least one other protected metal of higher work function. The preferred low work function metal is selected from the group of lithium, magnesium, calcium, strontium, and combinations thereof, while preferred high work function metal is selected from the group of aluminum, indium, copper, gold, silver and combinations thereof. Alternatively, the second electrode is formed of an alloy of lower work function metal and a high work function metal by co-evaporation. The content of the low work function metal and the second electrode can vary from 0.1% to 50% but typically is below about 20%.

The procedure described in the previous two paragraphs to fabricate OEDs on top of the structure of FIG. 4 is also applicable to fabricate OEDs on top of the structures shown in FIGS. 5 and 6.

As is well known in OED operation, holes inject from the first electrode (also called the anode) 12 and electrons inject from the second electrode 34 and 38 (also known as the cathode), into the organic layers disposed between the electrically conductive electrodes, when an electrical current is applied between the anode and the cathode. An electrical current may be applied by connecting the electrodes to electrical current generating means (not shown). As illustrated in FIG. 7, the electric current generating means attached to both electrode layer 12 and electrodes 34 and 38 will allow holes and electrons to recombine in the organic layer to generate a desired optical characteristic. Conversely, no current will flow through layers 32, 36 and 40, since said layer is electrically isolated from electrode 12 by dielectric layers. Thus, while layers of organic and electrode materials are deposited atop the wall structures, the wall structures themselves prevent those devices from being operative organic electroluminescent display pixels. Conversely, the devices disposed in the exposed areas between the wall structure are operative pixel elements which are optically isolated from one another by the wall structures. Hence, a pixelated display is provided Moreover, in the embodiment in which opaque dielectric material is used, there is enhanced contrast between and around each pixel thus providing an improved display.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A light emitting display device, comprising:

a transparent substrate having disposed on one surface thereof a layer of first electrically conductive material;

a plurality of spaced apart electrically insulating walls with each wall being defined by a pair of side surfaces and an adjoining upper surface, the walls being positioned on the layer of first electrically conductive material so as to define exposed areas of the layer of first electrically conductive material between opposed side surfaces of adjacent walls;

a blanket composite layer of organic material, including at least one layer of electroluminescent organic material, disposed on the exposed areas of the layer of first electrically conductive material and the upper surface of the spaced apart electrically insulating walls; and a blanket layer of second electrically conductive material disposed on the blanket composite layer of organic material with first portions overlying the exposed areas of the layer of first electrically conductive material and second portions overlying the upper surface of the spaced apart electrically insulating walls, the side surfaces of the spaced apart electrically insulating walls being formed to prevent electrical contact between the first and second portions of the blanket layer of second electrically conductive material, and the side surfaces of the spaced apart electrically insulating walls being further formed to prevent electrical contact between the first portions of the blanket layer of second electrically conductive material and the layer of first electrically conductive material.

2. A light emitting display device as in claim 1 wherein the plurality of spaced apart electrically insulating walls each include a middle portion, a top portion and a base portion, and the middle portion is narrower than said top portion and said base portion.

3. A light emitting display device as in claim 1 wherein said electrically insulating walls are formed of a dielectric material selected from the group of $SiO_x$, $SiN_x$, $SiC_x$, $MgF_x$, and combinations thereof.

4. A light emitting display device as in claim 1, wherein said electrically insulating walls are formed to a thickness of between 0.5 micrometer and 100 micrometer.

5. A light emitting display device as in claim 1, wherein said electrically insulating walls are opaque.

6. A light emitting display device as in claim 1 wherein said electrically insulating walls are fabricated of at least two layers of dielectric material.

7. A light emitting display device as in claim 1 wherein the plurality of spaced apart electrically insulating walls each include a middle portion, a top portion and a base portion, and the base portion is narrower than the top portion and the middle portion.

* * * * *